(12) United States Patent
Hooge et al.

(10) Patent No.: US 10,622,233 B2
(45) Date of Patent: Apr. 14, 2020

(54) AMELIORATION OF GLOBAL WAFER DISTORTION BASED ON DETERMINATION OF LOCALIZED DISTORTIONS OF A SEMICONDUCTOR WAFER

(71) Applicant: Tokyo Electron Limited, Tokyo (JP)

(72) Inventors: Joshua Hooge, Austin, TX (US); Nathan Ip, Austin, TX (US); Joel Estrella, Austin, TX (US); Anton Devilliers, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 60 days.

(21) Appl. No.: 16/054,725

(22) Filed: Aug. 3, 2018

(65) Prior Publication Data

US 2018/0342410 A1 Nov. 29, 2018

Related U.S. Application Data

(63) Continuation-in-part of application No. 15/695,966, filed on Sep. 5, 2017, now Pat. No. 10,431,468.

(60) Provisional application No. 62/383,549, filed on Sep. 5, 2016.

(51) Int. Cl.
| | | |
|---|---|---|
| *H01L 21/67* | (2006.01) | |
| *H01L 21/66* | (2006.01) | |
| *G06F 17/50* | (2006.01) | |
| *G06T 7/00* | (2017.01) | |

(52) U.S. Cl.
CPC .... *H01L 21/67288* (2013.01); *G06F 17/5009* (2013.01); *G06F 17/5018* (2013.01); *H01L 22/20* (2013.01); *G06T 7/0004* (2013.01); *G06T 2207/30148* (2013.01); *H01L 22/12* (2013.01)

(58) Field of Classification Search
CPC ............. G06F 17/5009; G06F 17/5018; H01L 21/67288; H01N 122/20; G06T 2207/30148; G06T 7/0004
See application file for complete search history.

(56) References Cited

U.S. PATENT DOCUMENTS

| | | | |
|---|---|---|---|
| 2012/0007052 A1 | 1/2012 | Hobbs et al. | |
| 2012/0182416 A1* | 7/2012 | Kawaguchi | H04N 9/3185 348/128 |
| 2012/0255365 A1* | 10/2012 | Wimplinger | H01L 21/67092 73/760 |
| 2013/0161756 A1 | 6/2013 | Glass et al. | |
| 2013/0270512 A1 | 10/2013 | Radosavljevic et al. | |

(Continued)

OTHER PUBLICATIONS

International Search Report and Written Opinion of the International Searching Authority dated Oct. 25, 2017 in PCT/US17/45864, filed Aug. 8, 2017 [citing references AA-AD therein] 12 pp.

*Primary Examiner* — Edward Park
(74) *Attorney, Agent, or Firm* — Oblon, McClelland, Maier & Neustadt, L.L.P.

(57) ABSTRACT

Disclosed herein is a technology related to the amelioration (e.g., correction) of global wafer distortion based on a determination of localized distortions of a semiconductor wafer. Herein, a distortion is either an out-of-plane distortion (OPD) or in-plane distortion (IPD). The reference plane for this distortion is based on the plane shared by the surface of a presumptively flat semiconductor wafer. This Abstract is submitted with the understanding that it will not be used to interpret or limit the scope or meaning of the claims.

20 Claims, 6 Drawing Sheets

(56) References Cited

U.S. PATENT DOCUMENTS

| | | | |
|---|---|---|---|
| 2013/0287319 A1* | 10/2013 | Yamamoto | G06T 3/0087 |
| | | | 382/293 |
| 2015/0192404 A1* | 7/2015 | Tang | G01B 9/02072 |
| | | | 356/503 |
| 2015/0228652 A1 | 8/2015 | Cheng et al. | |
| 2016/0371423 A1* | 12/2016 | Vukkadala | G06F 17/5081 |

* cited by examiner

Shape Data

Estimated IPD

Force approx from Curvature

AMELIORATION OF GLOBAL WAFER DISTORTION BASED ON DETERMINATION OF LOCALIZED DISTORTIONS OF A SEMICONDUCTOR WAFER

CROSS-REFERENCE TO RELATED APPLICATIONS

This application is a continuation in part of and claims priority to U.S. Non-Provisional Patent Application Ser. No. 15/671,771 filed on Aug. 8, 2017, the entire contents of which are herein incorporated by reference.

BACKGROUND

There are many steps involved in the typical manufacturing process of semiconductor wafers. For example, the typical incoming wafer (e.g., bare silicon wafer) starts with a deposition of an insulating layer (i.e., a dielectric film, such as glass). After that, a layer of a pattern mask is laid down on the insulating layer using lithography. Then, materials are selectively removed from these layers using etching. After that, the photoresist mask is removed (i.e., strip) and the residues and particles are removed (i.e., clean or polish). Finally, conducting material is deposited (i.e., deposition) for each semiconductor device of the wafer. In short, the simplified and typical steps include deposition, lithography, etch, strip, clean, and deposition. Of course, frequently, many of these steps are repeated to form multiple layers.

According to their design, each layer has a pattern of material that is laid down in a manner so that they align with the corresponding material of the adjacent layer. For example, contacts of one layer align with those of the next. Misalignments can cause short circuits and connection failures that impact the effective yield and costs. The alignment of the pattern of materials of adjacent layers is called overlay herein.

The overlay presumes that each layer is perfectly flat or nearly so. However, it is common for the wafer not to be flat, and indeed the wafer may be significantly curved. This is called a wafer bow. Because the wafer is not flat, a layer on that bowed wafer is likewise not flat.

The bow of a semiconductor wafer is the deviation of the center point of the median surface of a free, un-clamped wafer from the median surface to the reference plane, where the reference plane is defined by three corners of the equilateral triangle.

BRIEF DESCRIPTION OF THE DRAWINGS

The Detailed Description references the accompanying figures. In the figures, the left-most digit(s) of a reference number identifies the figure in which the reference number first appears. The same numbers are used throughout the drawings to reference like features and components.

DETAILED DESCRIPTION

Disclosed herein is a technology related to amelioration (e.g., correction) of global wafer distortion based on a determination of localized distortions of a semiconductor wafer. Herein, a distortion is either an out-of-plane distortion (OPD) or in-plane distortion (IPD). The reference plane for this distortion is based on the plane shared by the surface of a presumptively flat semiconductor wafer.

Thus, an out-of-plane distortion involves a bending, rippling, curved, etc. material of the wafer to extends above and/or below the reference plane. Thus, the wafer with an out-of-plane distortion is not flat.

Conversely, an in-plane distortion involves an expansion, stretching, or compression of material along the reference plane. Thus, the wafer may still be flat, but the density of the material is non-uniform, and/or the shape of the wafer is non-uniform.

Figure 1:
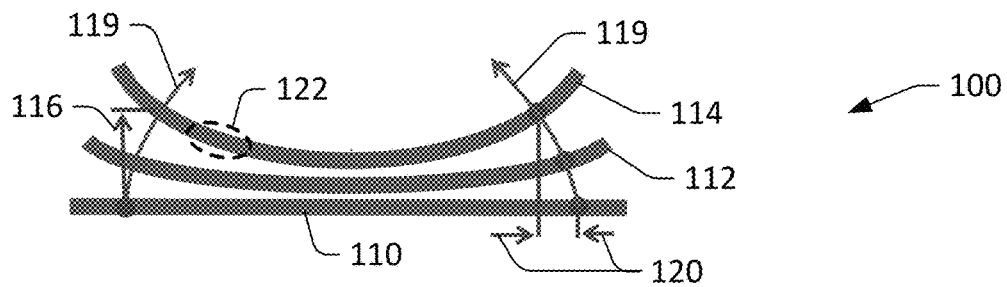
FIG. 1 shows different example representations of a distorted wafer in accordance with the technology described herein.
Figure 1:
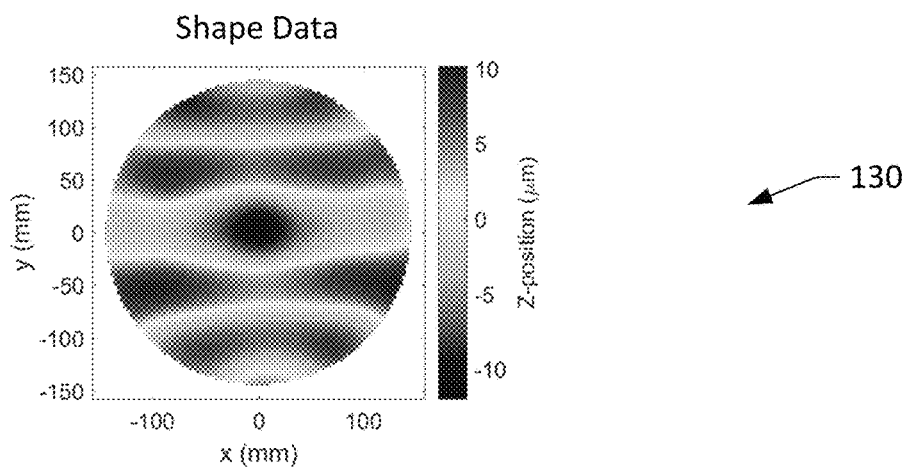
Figure 1:
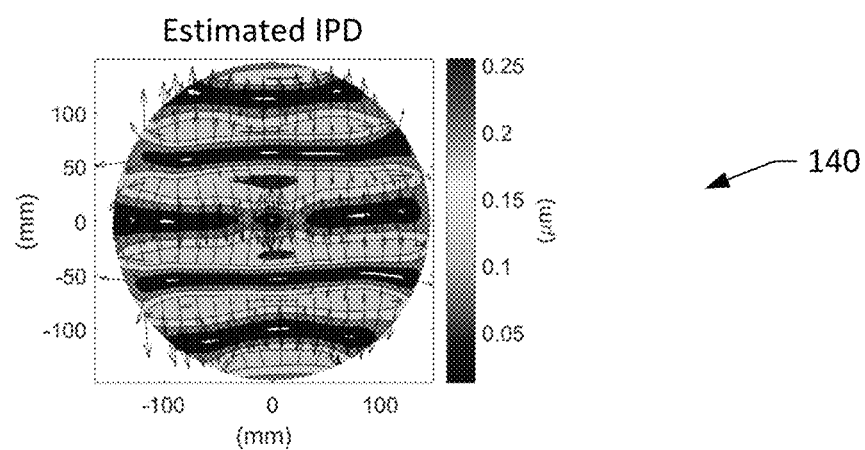
Figure 1:
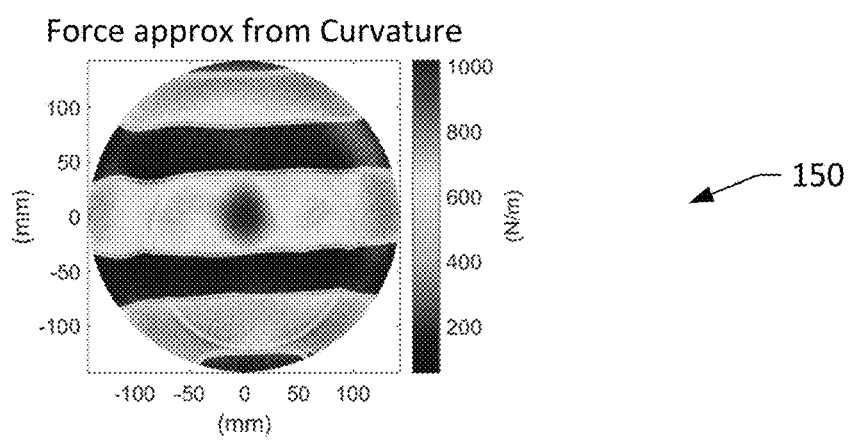

FIG. 1 shows an example of a distorted wafer 100. The example distorted wafer 100 is depicted as different wafer representations 110, 112, 114, which are shown in progressively increasing distortion. Wafer representation 110 is shown flat. Wafer representation 112 has a shallow bowl shape. Wafer representation 114 has a deeper bowl shape.

The shape of the example distorted wafer 100 may be caused by stresses or forces that act out-of-plane and in-plane. The expansion and contraction forces (i.e., x-direction and y-direction forces) push or pull the wafer in the same plane as the wafer itself and often produce some out-of-plane distortion as represented by the directional arrows of 119.

The vertical distortion shown by 116 causes a horizontal movement shown by 120. When the wafer is clamped on a table, the horizontal movement 120 can cause IPD and contribute to overlay.

Additionally, the horizontal forces can cause the wafers to expand or contract in the horizontal direction. These forces can cause additional distortion and overlay.

Herein, a global wafer distortion refers to the distortion of the entire semiconductor wafer and not just some part of it. That is, the global distortion of a wafer is a distortion that manifests as a whole or a substantial portion of the whole. Depending on the implementation, a substantial portion of the wafer for a global distortion is exhibited across more than 30%, more than 50%, or more than 65% of the wafer. For example, the overall bowl shape of the wafer representative 114 is an example of the global distortion.

In contrast, a local distortion refers to the distortion of just a part of the semiconductor wafer rather than the entire wafer. That is, the local distortion of a wafer is a distortion that manifests over an insubstantial portion of the whole. Depending on the implementation, an insubstantial portion of the wafer for a global distortion is exhibited across less than 30%, less than 15%, or less than 5% of the wafer.

For example, the local distortion of area 122 of the wafer representative 114 is indicative of local distortion. As used herein with one implementation, the local distortion applies to each discretized portion or area of the wafer. As used herein, a discretized portion or area of a wafer is called a pixel.

A wafer bow (i.e., first-order distortion) or wafer warp (i.e., second-order distortion) are examples of global distortions and, in particular, global out-of-plane distortions.

The technology described herein may include a determination of the local distortion of each of multiple discretized pixels of a semiconductor wafer. That determination is based on shape data of that wafer. The shape data represents the global distortion of the wafer.

For each of the pixels, the technology described herein may include an estimation of one or more forces (e.g., stresses) that pixel that produces the determined local distortion of that pixels and contributes to the global distortion of the semiconductor wafer. For each pixel, the technology described herein may generate an amelioration (e.g., correction) pattern of a backside layer that, when applied to the corresponding discretized pixel of the backside of the semiconductor wafer, ameliorates (e.g., corrects) the global and local distortion of the semiconductor wafer.

The top side of a substrate (e.g., wafer) typically receives a film stack, fabricated devices, partially fabricated devices, features, etc. Thus, the top side of the substrate can also be known as a working surface. The opposite side of the substrate from the top side is the backside of the substrate.

In semiconductor fabrication, substrates typically become distorted to the overlay of various films and devices being deposited and/or fabricated thereon. Such processes can include annealing and other treatments that tend to distort a substrate. Techniques herein, however, correct such distorting of substrates.

As semiconductor device fabrication technology advances, there are increasing demands on photolithography systems and coaters/developers used to manufacture the semiconductor devices. This includes increasing demands on the accuracy of substrate alignment. A substrate is typically mounted on a chuck, also referred to as a wafer table. During exposure, the features being exposed on the substrate need to overlay existing features on the substrate. To achieve desired overlay performance, the substrate is aligned to the substrate stage prior to exposure. An overlay error is a difference between predicted position and the actual position of the substrate.

A flattened substrate is one with minimal out-of-plane distortion. The presumption is that a flat substrate assures alignment of overlays. However, there is also distortion due to the horizontal forces on the wafer. That is, in-plane distortion. At least some of the implementations of the technologies described herein addresses the IPD of substrates, which may result from distortions from bending and stretching.

Figure 2:
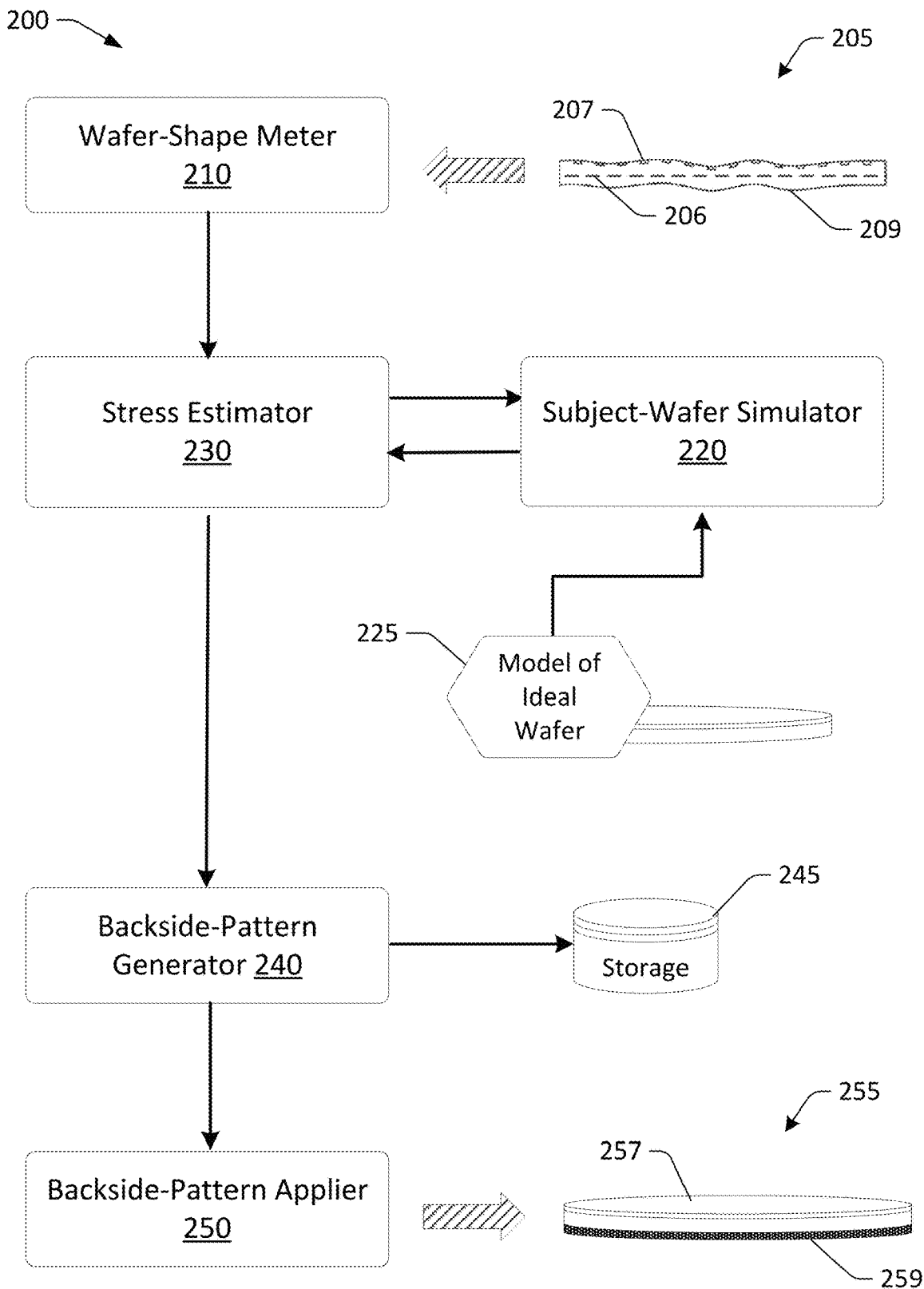
FIG. 2 is an example wafer distortion amelioration system 200 in accordance with the technology described herein.

FIG. 2 shows an example wafer distortion amelioration system 200. The example wafer distortion amelioration system 200 is an example of an implementation of the technology described here.

The example wafer distortion amelioration system 200 includes a wafer-shape meter 210, a subject-wafer simulator 220, a stress estimator 230, a backside-pattern generator 240, and a backside-pattern applier 250. Each of these components may be implemented, at least in part, by computing hardware, firmware, or a combination of hardware, firmware, and software.

The wafer-shape meter 210 acquires wafer-shape data about a subject wafer 205. The subject wafer 205 is a substrate that exhibits out-of-plane and/or in-plane distortion. Reference planar line 206 is not part of subject wafer 205, but merely illustrates a planar or flat reference point.

Subject wafer 205 has multiple semiconductor structures that are at least partially fabricated on a top surface 207 of the subject wafer 205. For example, such structures can include gates, transistors, trenches, vias, hard masks, films, etc. Thus, subject wafer 205 can be a semiconductor-grade substrate. The wafer has a backside surface 209 that is non-planar. The backside surface 209 is non-planar as a result of fabrication of the multiple semiconductor structures. The backside surface 209 is opposite the top surface 207 (also known as a working surface).

Note that the entire subject wafer 205 can have bowing (including top surface 207) and that this bowing is at least manifest in the backside surface 209. Also note that initially, the subject wafer 205 can be planar in that surface height deviations can remain within a tolerance of about 100 nanometers or even 10 nanometers. Also, note that being non-planar herein is relative to micron distances or micron scaling. For example, surface height deviations of greater than about 1 microns to approximately 300 microns can be considered non-planar. Thus, from inspection by eye the substrate may appear perfectly flat, but relative to the resolution capability of photolithography systems and other such systems, the substrate is not sufficiently flat.

Conventionally, a given substrate can develop a bow or deflection of between 1 and 400 microns. While the exposure can sometimes account for some deflection, the overlay is still impacted by the deflection.

The wafer-shape meter 210 either measure directly or receives the measurements of the curve or shape of the subject wafer 205 from a metrology tool (e.g., Patterned Wafer Geometry tool made by KLA-Tencor). These measurements may be called deflection measurements or wafer-shape data. Such deflection measurement can be accomplished using various mechanisms, such as optical detection, reflective techniques, and acoustic measurements. This measurement essentially measures out-of-plane distortion.

For example, this can include creating x,y or radial locations of a given substrate that include a z-height measurement or relative deflection tied to a planar coordinate system. This can be a positive or negative value to distinguish between convex and concave portions, though other scaling systems can be used. Thus, the deflection signature maps relative differences in height by lateral location (i.e., spatial location) on the substrate.

Chart 130 of FIG. 1 is an example of a two-dimensional (2D) chart of the wafer-shape data obtained from a wafer. The shading indicates the out-of-plane (i.e., Z-position) distortion as plotted on the area of the wafer.

The wafer-shape meter 210 may apply spatial filters to the wafer-shape data and process that data using mathematical function (e.g., Zernike polynomials). The operation of the wafer-shape meter 210 may be described as obtaining shape data of a semiconductor wafer, wherein the shape data represents a global distortion of the semiconductor wafer.

The subject-wafer simulator 220 generates a simulation or model of the subject wafer 205 based data from a wafer model 225 and in cooperation with the stress estimator 230. The wafer model 225 is a highly detailed physics model of an initially flat wafer subjected to idealized film stress (e.g., equibiaxial film stress). This may be accomplished, for example, by use of a Finite Element (FE) model which uses the FE method (FEM) for finite element analysis (FEA).

The FEM is a numerical method for solving problems of engineering and mathematical physics. Typical problem areas of interest include structural analysis, heat transfer, fluid flow, mass transport, and electromagnetic potential. The analytical solution of these problems generally requires the solution to boundary value problems for partial differential equations. FEM subdivides a large problem into smaller, simpler parts that are called finite elements. The simple equations that model these finite elements are then assembled into a larger system of equations that models the entire problem.

To start, the subject-wafer simulator 220 discretized the idealized wafer model 225 into a grid or array of areas or chunks. The grid may be, for example, a Cartesian grid, a rectilinear grid, a curvilinear grid, or a structured grid. Herein, these chunks are called "pixels" because they are analogous to a picture element (i.e., pixel) of a television screen. This action may be discretization, chunking, or pixilation herein.

Figure 3:
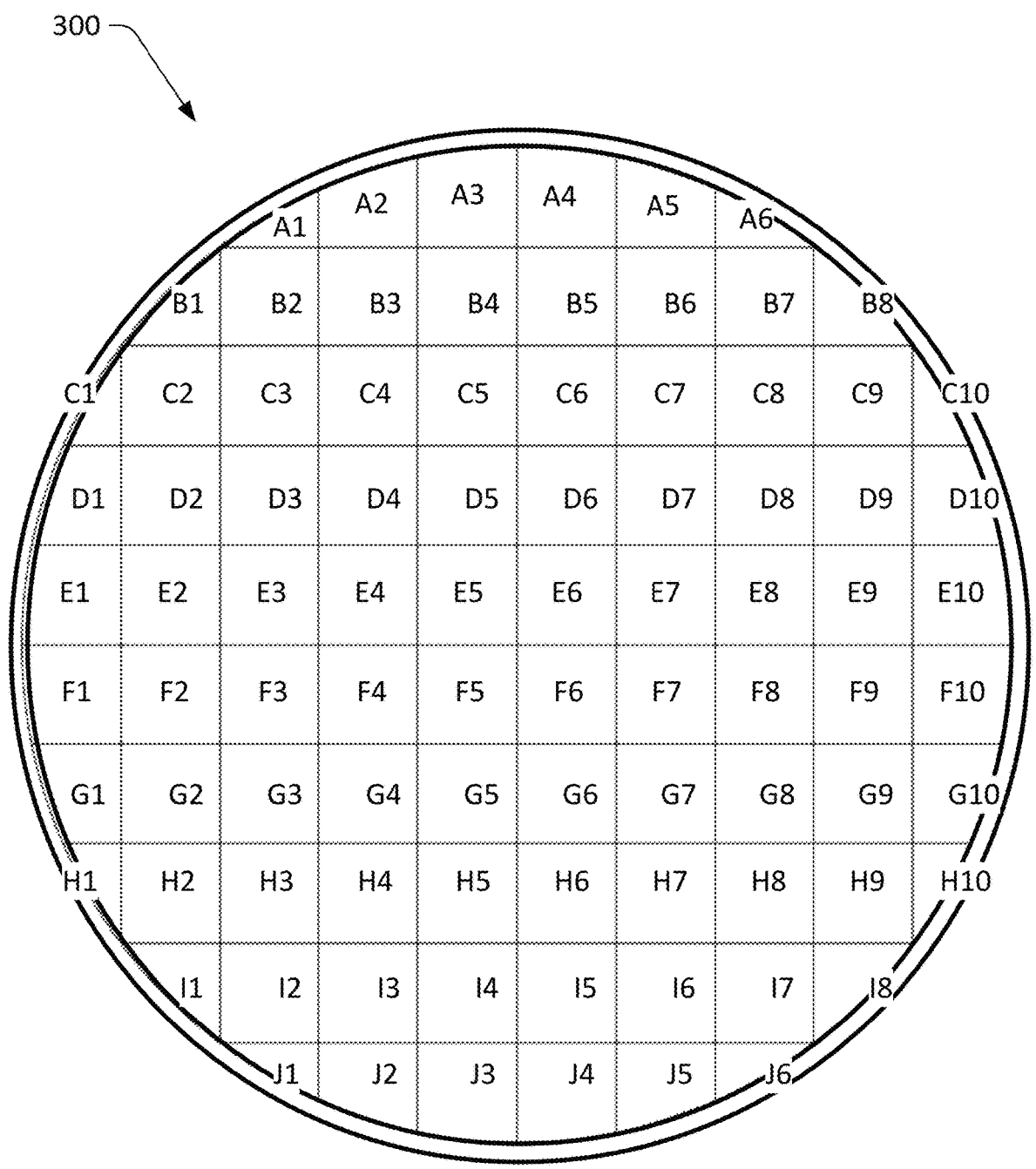
FIG. 3 is an example representation of a discretized wafer simulation in accordance with the technology described herein.

FIG. 3 shows an example wafer simulation 300 with a Cartesian grid of pixels applied thereto. The pixels are numbered A1-J6 in sequence with the first letter representing a row while the number represents the column position in that row. This example wafer simulation 300 is provided for illustration purposes only. It is referenced herein to explain better one or more implementations of the technology described herein.

After the pixelization, the components of the example wafer distortion amelioration system 200 operate, at the lowest level, on the pixels of the simulation of the subject wafer 205. Thus, the data of the idealized wafer model 225 is gathered together in chunks that correspond to each pixel. Typically, the simulation of the subject wafer 205 has the fine level detail of minute portions of the wafer.

After the pixelization, the relevant data of each pixel is collected for that pixel. That is, relevant data of a pixel includes data that may impact distortion. For example, all of the relevant data of the area that corresponds to pixel F4 of the idealized wafer model 225 collected together and applied to the pixel F4 in the simulation of the subject wafer 205.

The stress estimator 230 estimates the stress on the subject wafer 205 based on the film(s) on the top surface 207 of that wafer. That estimate is based on the shape data obtained by the wafer-shape meter 210. This can be accomplished via conventional approaches or novel approaches. For example, the Stoney equation may be employed to determine the stress induced on a wafer based on its shape.

Chart 140 of FIG. 1 is an example of a 2D chart of the estimated in-plane distortion (IPD) data derived from a calculation of the slope of the wafer-shape data. The shading indicates the relative amount of IPD as plotted on the area of the wafer. For a stressed film on one side of the wafer, the slope of the data points in a given direction is proportional to the IPD which contributes to overlay error when the wafer is chucked.

The IPD can be approximated to the slope of the wafer bow through this equation:

$$u \approx u_{stretching} + u_{bending}$$
$$= -\frac{h_s}{3}\frac{\partial w}{\partial x} - z\frac{\partial w}{\partial x}$$

Equation 1

The first term represents the in-plane stretching due to the film stress and the second term represents the bending caused by the film stress. With this equation, the measured wafer bow (which is an example of the wafer shape data) can be converted to IPD.

A large portion of the bending component is reduced when the wafer is placed onto a table. Then, a large portion of the stretching component is accounted for by the lithography tool. The remaining components contribute to overlay.

Stress in a thin film on a flexible substrate (such as a wafer) induces a curvature of the substrate. Usually, the substrate is orders of magnitude thicker than the film, leading to small and purely elastic deformation of the substrate. In this case, the Stoney equation yields the stress in the film from the measured curvature of the substrate. The Stoney equation contains thickness of film and substrate and the elastic properties of the substrate. Typically, the elastic properties of the substrate are specified by E (Young's modulus), and v (Poisson's ratio).

Stoney's equation is the first theory that correlates with wafer shape, w, and the stress of the thin film coating, $\sigma_f$. The Stoney's equation is given by:

$$\sigma_f h_f = \frac{E_s h_s^2}{6(1-v_s)}\kappa$$

Equation 2

Where $\sigma_f$ and $h_f$ are the film stress and thickness respectively; $E_s$, $v_s$, $h_s$ are the Young's modulus, Poisson's ratio and thickness of the substrate respectively; and K is the deformed curvature of the wafer. The curvature K can be obtained by taking the second derivative of the wafer shape, $$\kappa = \left(\frac{\partial^2 w}{\partial x^2} + \frac{\partial^2 w}{\partial y^2}\right)/2.$$

Using the discretized wafer simulation provided by the subject-wafer simulator 220, the stress estimator 230 estimates the forces acting on each pixel of the wafer simulation. The estimation of the forces at each pixel takes into consideration the effect of the force on its own pixel and the effect of the force on other pixels. Indeed, the effect of a pixel's force on every pixel (including itself) is factored into the estimation of that force. An amplitude of a pixel's force is selected based on the impact of that force closely matching the wafer-shape data.

Chart 150 of FIG. 1 is an example of a 2D chart of the estimated force from the wafer-shape data. The shading indicates the relative amount of force as plotted on the area of the wafer. This may be calculated by taking the slope of the estimated IPD to get the curvature which is mathematically related to the stress.

In so doing, a pixel's force(s) that are being estimated are constant ones that are assumed to be applied across the entire pixel. Herein, this may be called activating pixels with constant film stress.

In addition, the subject-wafer simulator 220 and the stress estimator 230 work cooperatively to interactively improve the estimates. That is, the estimates of each pixel's forces are interactively improved to optimize their match to the forces that would produce a wafer having the distortion of the obtained wafer-shape data. This process may be assisted by the creation and use of libraries of calculations for each pixel. The effect of having such libraries is to reduce the amount to recalculation that is needed for each iteration.

The libraries are created using finite element simulations. An example library includes the distortion of the subject-wafer for several film stress profiles. The example library is generated by discretizing the top surface of the wafer into many small pieces (i.e., pixels) and applying uniform stress to each piece, one at a time.

The finite element simulation outputs the distortion that corresponds to the effect of the piece. In this way, a film stress profile can be represented by a discretized distribution of stresses across all pieces. Then, by the rule of superposition, all pieces can add up together to form an overall distortion.

Such a library can be used to compare against the distortion to obtain a film stress profile. From the distortion, the film stress profile is solved by varying the stresses in each piece, which changes the distortion contribution in the piece, through an optimization approach.

The results from the simulation library method are comparable to a full finite element simulation. However, the simulation library method usually computes the solution within a minute while a full finite element simulation that can take many times longer.

The cooperative operation of the subject-wafer simulator 220 and the stress estimator 230 may be described as determining, based on the obtained shape data, local distortion of each of multiple discretized pixels of the semiconductor wafer and estimating one or more forces at each pixel that produces the determined local distortion of each of the multiple pixels and contributes to the global distortion of the semiconductor wafer.

The backside-pattern generator 240 receives the optimized estimation of the force(s) acting on each pixel of the subject-wafer simulation, which is the result of the cooperation of the subject-wafer simulator 220 and the stress estimator 230. For each of the multiple discretized pixels and using the estimated force(s) for each pixel, the backside-pattern generator 240 generates an amelioration pattern of a backside layer that, when applied to a corresponding discretized pixel of the backside of the semiconductor wafer, ameliorates the global and local distortion of the semiconductor wafer.

As used herein, ameliorates includes reducing the distortion of the subject wafer. In some implementations, the action may be called a correction. Regardless, the amelioration action results in the application of a backside layer that reduces the out-of-plane and/or the in-plane distortion. Various factors go into generating the backside pattern. Those factors include, at least in part, on the compressive/tensile stress of the backside film, the thickness of the film, and the designed pattern/stress distribution profile of the backside film.

The backside-pattern generator 240 may store the backside pattern in a storage 245 as a digital file (e.g., an image) or a database of such patterns.

Alternatively, the backside-pattern generator 240 may generate a set of instructions that direct an appropriate tool to produce the backside pattern. That set of instructions may be sent straight to such a tool or may be stored in the storage 245.

The backside-pattern applier 250 is the tool or set of tools that produce and deposits the backside pattern to the backside of the subject wafer. As a result, the distortion of the subject wafer is reduced and perhaps eliminated.

The amelioration action performed by the backside-pattern applier 250 may be accomplished by depositing one or more films on the backside surface to assist with distortion correction. FIG. 2 shows substrate 255, which is a corrected version of the subject wafer. The substrate 255 has a top surface 257 and a backside surface with a backside film 259 deposited thereon. The backside film 259 is deposited on the backside surface that may, for example, either pulls a substrate inwardly or pushes outwardly.

In some implementations of the example system 200, the system may presume that the subject wafer is ideal. That is, the film on the wafer is uniform. In other implementations, this is not assumed and, indeed, non-uniformity of the films on the wafer is expected and accounted for.

A number of non-idealities are present in the wafer and the processing of that wafer which can increase the error in predicted vs. actual result. Such non-idealities include (for example): backside film thickness uniformity across the wafer, variation in the set dose vs actual dose with which the correction film is exposed across the wafer, the placement of backside patterns, variation in the etching and etch profile of those backside patterns across the wafer, and systematic errors due to limitations in the fidelity of the simulation.

An experimentally determined database of stored calibration files which are updated periodically or with each wafer is used to redefine the upper and lower boundaries of stress that is possible on a given pixel. The backside pattern is then optimized with these new boundaries.

Figure 4:
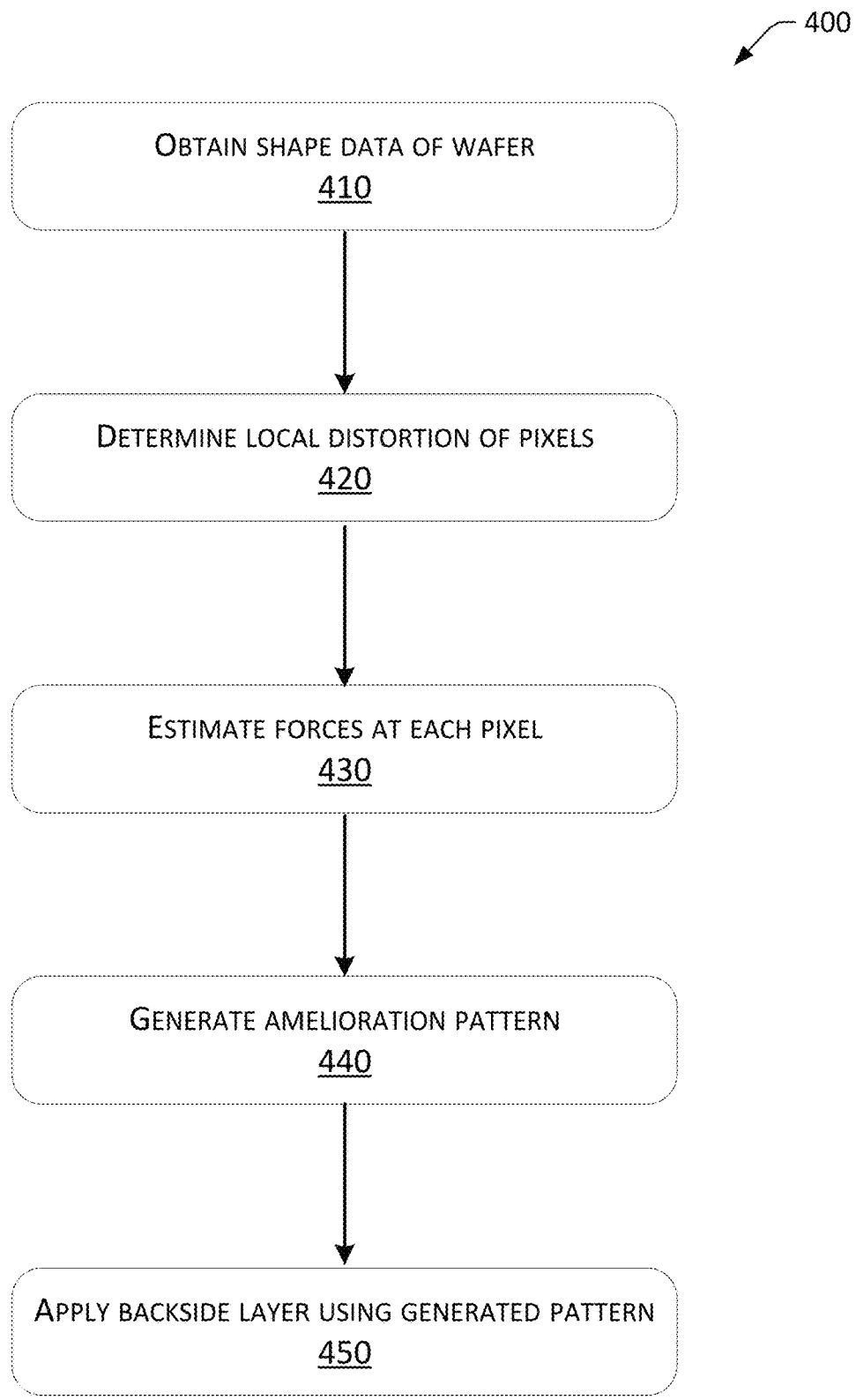
FIG. 4 is a flowchart of an example process in accordance with the technology described herein.

FIG. 4 is a flow diagram illustrating example process 400 that implement the techniques described herein for the amelioration of global wafer distortion based on the determination of localized distortions of a semiconductor wafer. The example process 400 is performed, at least in part, by the example wafer distortion amelioration system 200. For simplicity, the actor that performs the operation is called a "system." Of course, depending on the implementation, the actions can be performed by a component of the system, components of the system, or by a device that is not specifically part of a system.

At block 410, the system obtains shape data of a semiconductor wafer. Chart 130 of FIG. 1 is a representation of that shape data. That data may be obtained from a direct or indirect measurement of a subject wafer. The shape data represents a global distortion of the semiconductor wafer.

At block 420, the system determines, based on the obtained shape data, local distortion of each of multiple discretized pixels of the semiconductor wafer. The system pixelized a map or model of the wafer. Then the system determines or estimates the amount of local distortion (e.g., out-of-plane and/or in-plane distortion) for each pixel.

In some implementations, the system compares the shape data directly with the library. An optimization loop compares all the points and effects of pixels simultaneously.

The determination of local distortions may include mapping the multiple discretized pixels onto the semiconductor wafer. Each multiple discretized pixel being mapped to an area of the semiconductor wafer. The determination may also include, for each of the multiple discretized pixels, calculating a value of local distortion that represents the amplitude of distortion for that pixel.

Depending on the implementation of the example process 400, the global distortion may include just the out-of-plane distortion, just the in-plane distortion, or both types of distortion. Similarly, the local distortion may include just the out-of-plane distortion, just the in-plane distortion, or both types of distortion.

At block 430, the system estimates one or more forces at each pixel that produces the determined local distortion of each of the multiple pixels and contributes to the global distortion of the semiconductor wafer. The estimation of the one or more forces at each pixel takes into consideration the effect of the one or more forces on its own pixel and the effect of the one or more forces on other pixels. Indeed, the effect of a pixel's force(s) on every pixel (including itself) is factored into the estimation of that force(s). An amplitude of a pixel's force(s) is estimated based on the impact of that force closely matching the wafer-shape data.

The estimation of the one or more forces at each pixel may include modeling forces a pixel that replicates the local distortion of that pixel and contributes to the global distortion; iteratively performing the modeling with varying forces until an optimized value of one or more forces is found for each pixel; and assigning the optimized value of the one or more forces to its pixel.

At block 440, for each of the multiple discretized pixels and using the estimated forces for each pixel, the system generates an amelioration pattern of a backside layer that, when applied to a corresponding discretized pixel of a backside of the semiconductor wafer, ameliorates the global and local distortion of the semiconductor wafer.

In some instances, the generation of the amelioration pattern includes storing an image of the amelioration pattern or producing instructions to direct a tool to apply the backside layer to the backside of the semiconductor wafer using the generated amelioration pattern.

At block 450, the system applies the backside layer to the backside of the semiconductor wafer. The backside layer is patterned in accordance with the generated amelioration pattern. This action will reduce the global distortion of the wafer.

With some implementations, the system sends information about the adjustments made by the backside layer(s) to one or more tools in the semiconductor fabrication process so that those tools can take the adjustments into consideration for their processes. This may be called feed-forwarding the impact of the amelioration pattern to other tools in the fabrication process.

The photolithography tool is an example of a semiconductor fabrication tool that the system may feed-forward such information. Typically, a scanner of a photolithography tool accounts for overlay without any expectation of correction of the overlay that the example process 400 might perform.

During the alignment process of the photolithography tool, the scanner implements a set of correction parameters (e.g., magnifications, rotations, etc.) to create the smallest overlay residual. Typically, some wafers are processed, and the overlay is measured to determine the best settings for these parameters which are then continually adjusted in a feedback loop.

Since any amelioration pattern applied to the back of the wafer will impact the distortion and thus the optimized values of these parameters, the system may feed forward distortion information or even new optimized corrections to the scanner.

Figure 5:
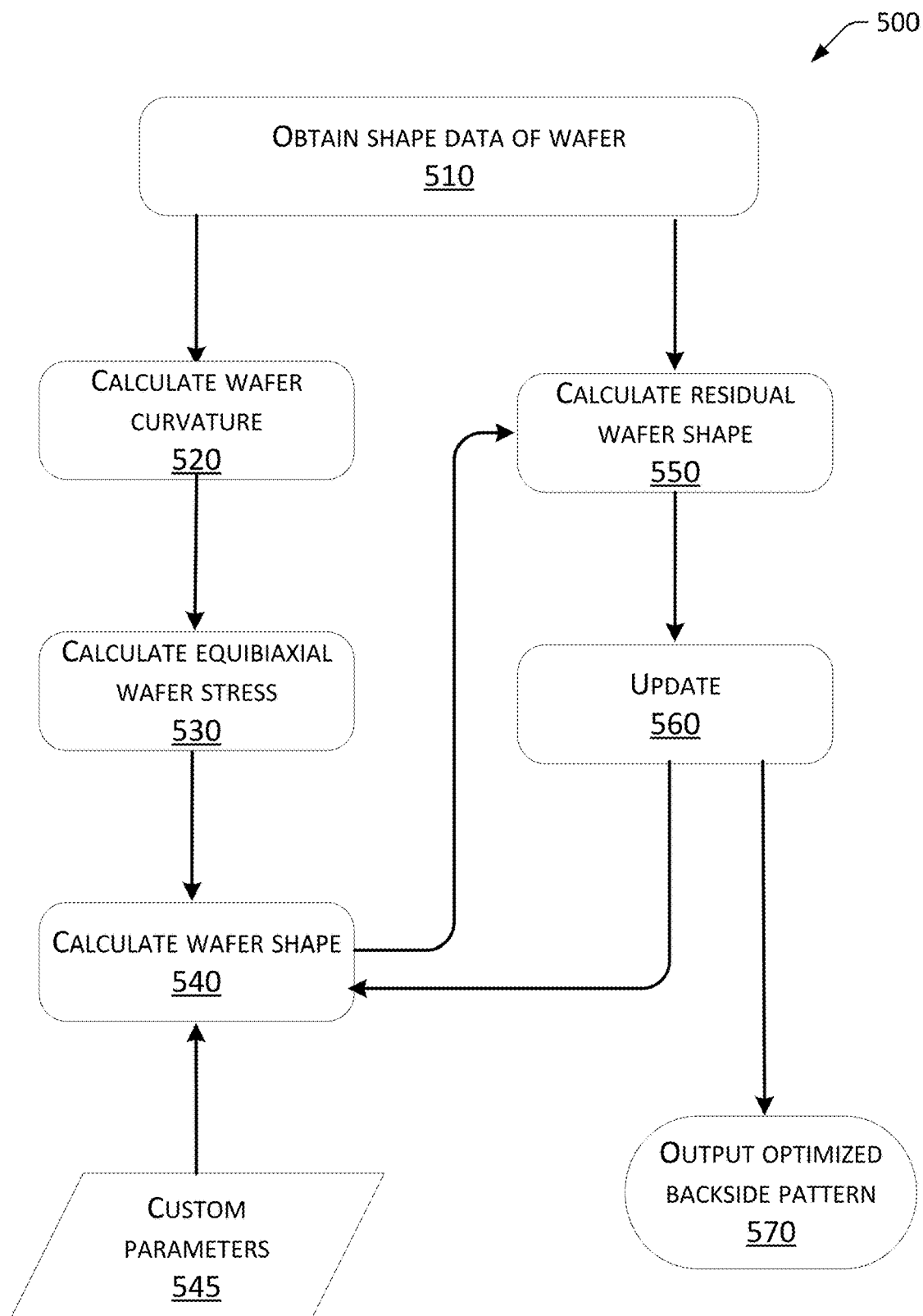
FIG. 5 is a flowchart of an example process in accordance with the technology described herein.

FIG. 5 is a flow diagram illustrating an example process 500 that implement the techniques described herein for the amelioration of global wafer distortion based on the determination of localized distortions of a semiconductor wafer. The example process 500 is performed, at least in part, by the example wafer distortion amelioration system 200. For simplicity, the actor that performs the operation is called a "system." Of course, depending on the implementation, the actions can be performed by a component of the system, components of the system, or by a device that is not specifically part of a system.

The example process 500 implements an approach called the curvature method. This approach accounts for non-uniform film stress and for the correction of shapes that originate from non-equibiaxial stress. The following equations (which are an extension of Stoney's equation) are examples of equations that may be employed that account for non-uniform film stress $$\sigma_f h_f = \frac{E_s h_s^2}{6(1-v_s^2)} \left[ \nabla^2 w + A_0 + \sum_{n=1}^{\infty} A_n r^n \cos n\theta + B_n r^n \sin n\theta \right]$$ Equations 3

$$A_0 = -\frac{1-v_s}{2\pi} \int_0^{2\pi} \kappa_{\theta\theta}(R,\theta) d\theta$$

$$A_n = -\frac{1-v_s}{\pi R^n} \int_0^{2\pi} \kappa_{\theta\theta}(R,\theta) \cos n\theta d\theta$$

$$B_n = -\frac{1-v_s}{\pi R^n} \int_0^{2\pi} \kappa_{\theta\theta}(R,\theta) \sin n\theta d\theta$$

These are examples of the plate theory equations that may be used. Using such equations, the non-uniform film stress can be related to the local curvature $\nabla^2 w$. Solving such equations using the measured wafer bow gives the backside correction pattern for the curvature method.

At block 510, the system obtains shape data of a semiconductor wafer. Chart 130 of FIG. 1 is a representation of that shape data. That data may be obtained from a direct or indirect measurement of a subject wafer. The shape data represents a global distortion of the semiconductor wafer. In addition, the system may apply spatial filters to the wafer-shape data and process that data using mathematical function (e.g., Zernike polynomials).

At block 520, the system calculates wafer curvature. This may be done, for example, by finding the curvature based on the obtained shape data. This may be done, at least in part, by calculating the slope of z-height shape data using a given number of measurement points in the x-direction and in the y-direction and then calculate the slope again of the slope data to get the curvature.

At block 530, the system calculates equibiaxial wafer stress. The system smooths data by applying a spatial filter; then the system takes the numerical derivatives of the filtered data to get the IPD and curvatures. The system applies the plate theory outlined in equation 3 above with custom parameters to calculate the wafer stress.

At block 540, the system calculates wafer shape based, at least in part, on custom parameters 545. The custom parameters 545 include, for example, the number of backside layers, the film properties, coverage boundaries, and pixel size.

At block 550, the system calculates residual wafer shape. The residual wafer shape is defined as the difference between the shape data of wafer 510 and the calculate wafer shape 540.

At block 560, the system updates. The following may be updated: global stress map multiplier; shift stress map uniformity; and non-equibiaxial stress correction pattern. Update adjust parameters to reduce residual wafer shape. These parameters could include: a global stress adjustment, a known stress pattern designed to counteract a specific shape, a known shape caused by non-equibiaxial stress behavior, modifications to the slope of the stress between high and low-stress areas, and additional analytical terms to the model.

Collectively, blocks 540, 550, and 560 form an optimization loop that is repeated until optimized results are found. In this loop, the system optimizes for the number of analytical terms to include in the plate theory equations based on the raw data and solve for the stress.

The system optimizes the thickness of a dual stack of compressive or tensile base layer covered by a patterned film of opposing stress to capture the highest possible range of the stress determined previously. The system converts the map of the stress into a map of the percentage of corrective coverage of the film. Then the system converts the percentage coverage in a given section to pattern with that percent coverage.

For example, there may be an optimization of the thickness of a dual stack of a compressive or tensile base layer covered by a patterned film of opposing stress to capture the highest possible range of the stress. Consider a wafer where it is determined that the local in-plane force (e.g., stress*thickness) is caused by the pattern varies from −200 N/m to +500 N/m.

The optimization ends when a series of metrics such as residual wafer shape, the residual IPD, local stress variation, etc. meet a predefined value.

It is desirable to generate a backside pattern that cancels out the topside stress. However, when a pattern is generated, the system should be careful to avoid removing too much of the film (e.g., more than 75%) in a given area (for example because the scanner chuck pin diameter of 50 um) or there is a risk of unevenness between an area where the scanner chuck pin can rest on the film and an area where it cannot.

Given these constraints of this example, then a patterned backside film is generated with an in-plane force of (500−(−200))/0.75=700 N/m over a blanket film of −433 N/m.

At block 570, the system generates an optimized backside pattern. The percent coverage is converted to a pattern which guarantees minimum coverage at a finer level specific to tool requirements (e.g., chucking) and maximizes the fidelity of the percentages which can be implemented.

Figure 6A:
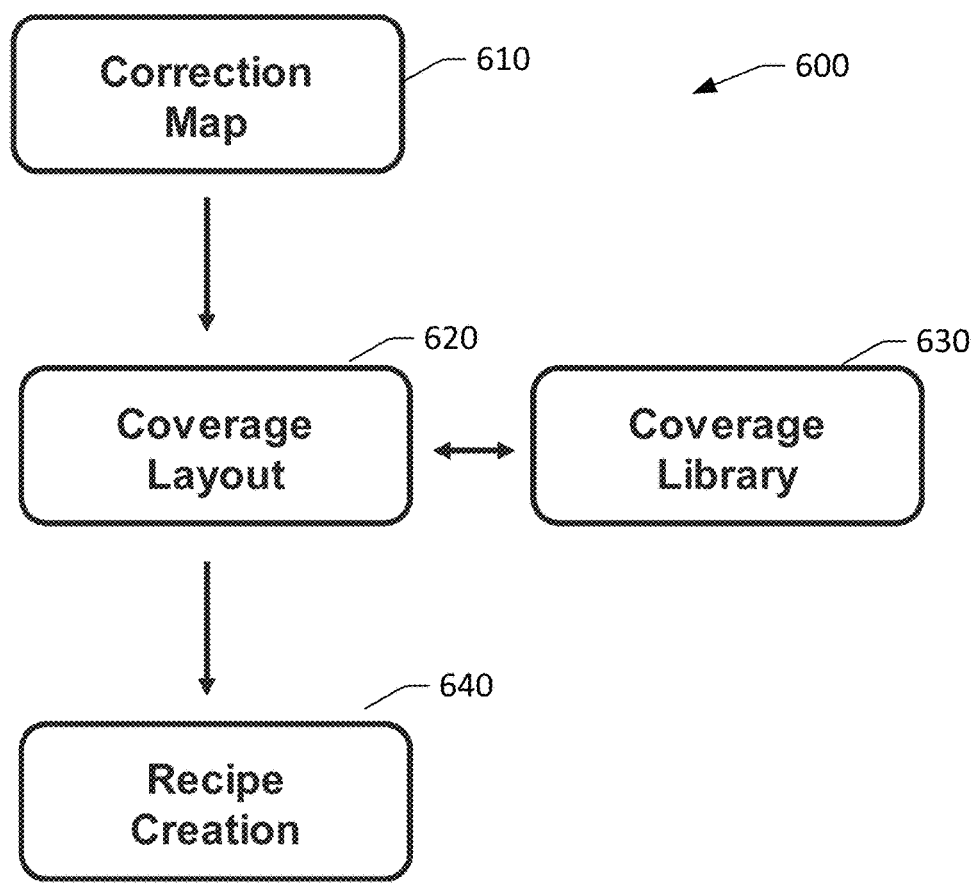
FIG. 6A is a flowchart of an example process in accordance with the technology described herein.

FIG. 6A is a flow diagram illustrating example process 600 that implements the generation of the amelioration pattern as described herein for the amelioration of global wafer distortion based on the determination of localized distortions of a semiconductor wafer. That is, the example process 600 may be part of the implementation of block 570 of the example process 500 and/or block 440 of the example process 400.

The example process 600 is performed, at least in part, by the example wafer distortion amelioration system 200. For simplicity, the actor that performs the operation is called a "system." Of course, depending on the implementation, the actions can be performed by a component of the system, components of the system, or by a device that is not specifically part of a system.

Figure 6B:
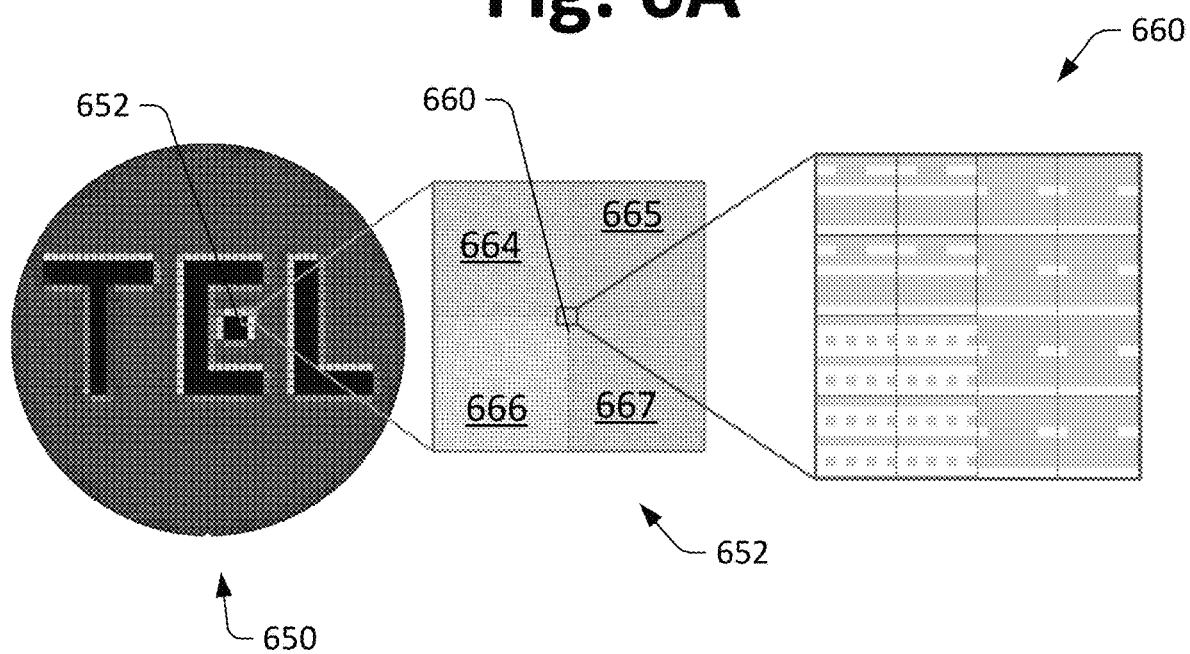
FIG. 6B is an illustration of the generation of the amelioration pattern in accordance with the technology described herein.

FIG. 6B illustrates details of an example correction map produced by the example process 600. Pattern 650 represents an example final amelioration pattern produced by the example process 600. An enlarged block 652 is one small portion of the pattern 650.

At block 610, the system receives the correction map, which is an example of the initial amelioration pattern. The correction map indicates the stress or forces that the ultimate backside pattern should have. The example process 600 determines exactly how the particular and low-level details of a final pattern that will accomplish the counterforces and stresses necessary for that backside pattern.

The correction map is an analog amount of stress applied to a pixel of a backside of a wafer that counteracts the distortion of that pixel on the frontside of the wafer. But the stress is applied with a digital pattern of areas of film and no film on the back of the wafer. Square 660 of FIG. 6 shows and example of three different digital patterns in it four sub-blocks.

The backside pattern (or amelioration pattern more generally) that is designed or optimized to reduce the distortion with the application of the pattern to the backside of the wafer. This pattern is outputted by, for example, block 560 of the example process 500 and/or block 440 of the example process 400.

At block 630, the system produces the coverage layout. The digital pattern is the coverage layout. In the coverage layout each pixel (e.g., 6 mm) is subdivided into smaller pixels (e.g., 200 um) which have a pattern chosen from the coverage library 630. The sub-blocks (664, 665, 666, 667) are examples of the smaller pixels.

These patterns achieve the desired stress for the subpixel while ensuring level contact between the wafer and scanner chuck. These subpixels also allow use to blur the boundaries between subpixels and pixel to get a more continuous change in stress between the pixels.

At block 640, the system produces the recipe or instructions for creating the final backside pattern. For the recipe creation, the coverage layout is converted into a set of instructions in the machine language of a processing tool (e.g., an exposure tool).

For example, consider the backside pattern 650. The pattern 650 includes an array of blocks, such as block 652. Each block (e.g., block 652) is further composed of multiple sub-blocks. As depicted, block 652 has four sub-blocks (664, 665, 666, 667).

Each of these sub-blocks (664, 665, 666, 667) are designed to produce a particular counterforce of the sub-block collectively. To achieve this, a repeating pattern of structures are used in each sub-block that is known to achieve the desired counterforce for the sub-block.

Square 660 is an enlargement of a four-corner area where all four sub-blocks (664, 665, 666, 667) of block 652 meet. As depicted, each corresponding portion of the sub-blocks in the square 660 has its own digital pattern. That digital pattern of each sub-block matches the desired counterforce for that sub-block.

In addition, in some implementations, it may be desirable to avoid harsh pattern changes between blocks and sub-blocks. Thus, those implementations may smooth the borders between blocks and sub-blocks by employing transitioning patterns within a small distance from those borders.

ADDITIONAL AND ALTERNATIVE IMPLEMENTATION NOTES

In the above description of exemplary implementations, for purposes of explanation, specific numbers, materials configurations, and other details are set forth in order to better explain the present invention, as claimed. However, it will be apparent to one skilled in the art that the claimed invention may be practiced using different details than the exemplary ones described herein. In other instances, well-known features are omitted or simplified to clarify the description of the exemplary implementations.

The inventors intend the described exemplary implementations to be primarily examples. The inventors do not intend these exemplary implementations to limit the scope of the appended claims. Rather, the inventors have contemplated that the claimed invention might also be embodied and implemented in other ways, in conjunction with other present or future technologies.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts and techniques in a concrete fashion. The term "techniques," for instance, may refer to one or more devices, apparatuses, systems, methods, articles of manufacture, and/or computer-readable instructions as indicated by the context described herein.

As used in this document, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, as used in this document, the term "and/or" is intended to mean either or both of the stated possibilities are valid or true. That is, unless specified otherwise or clear from context, "X employs A and/or B" is intended to mean that either A or B or both A and B.

The articles "a" and "an" as used in this application and the appended claims should generally be construed to mean "one or more," unless specified otherwise or clear from context to be directed to a singular form.

These processes are illustrated as a collection of blocks in a logical flow graph, which represents a sequence of operations that can be implemented in mechanics alone or a combination with hardware, software, and/or firmware. In the context of software/firmware, the blocks represent instructions stored on one or more computer-readable storage media that, when executed by one or more processors, perform the recited operations.

Note that the order in which the processes are described is not intended to be construed as a limitation, and any number of the described process blocks can be combined in any order to implement the processes or an alternate process. Additionally, individual blocks may be deleted from the processes without departing from the spirit and scope of the subject matter described herein.

The term "computer-readable media" includes computer-storage media. For example, computer-storage media may include, but are not limited to, magnetic storage devices (e.g., hard disk, floppy disk, and magnetic strips), optical disks (e.g., compact disk (CD) and digital versatile disk (DVD)), smart cards, flash memory devices (e.g., thumb drive, stick, key drive, and SD cards), and volatile and non-volatile memory (e.g., random access memory (RAM), read-only memory (ROM)).

Unless the context indicates otherwise, the term "logic" used herein includes hardware, software, firmware, circuitry, logic circuitry, integrated circuitry, other electronic components and/or a combination thereof that is suitable to perform the functions described for that logic.

What is claimed is:

1. A method comprising:
    obtaining shape data of a semiconductor wafer, wherein the shape data represents a global distortion of the semiconductor wafer;
    determining, based on the obtained shape data, local distortion of each of multiple discretized pixels of the semiconductor wafer;
    estimating one or more forces at each pixel that produces the determined local distortion of each of the multiple pixels and contributes to the global distortion of the semiconductor wafer;
    for each of the multiple discretized pixels and using the estimated forces for each pixel, generating an amelioration pattern of a backside layer that, when applied to a corresponding discretized pixel of a backside of the semiconductor wafer, ameliorates the global distortion of the semiconductor wafer.

2. A method of claim 1, further comprising applying the backside layer to the backside of the semiconductor wafer, wherein the backside layer is patterned in accordance with the generated amelioration pattern.

3. A method of claim 1, wherein the generation of the amelioration pattern includes:
    storing the amelioration pattern;
    storing an image of the amelioration pattern; or
    producing instructions to direct a tool to apply the backside layer to the backside of the semiconductor wafer using the generated amelioration pattern; or
    determining dimensions of the amelioration pattern for the backside layer applied to the semiconductor wafer; or
    determining dimensions and/or composition of the backside layer to be applied to the backside of the substrate.

4. A method of claim 1, wherein the global distortion includes a distortion of a wafer that manifests across a substantial portion of the wafer.

5. A method of claim 1, wherein the local distortion includes a distortion that manifests over an insubstantial portion of the wafer.

6. A method of claim 1, wherein the global distortion and/or local distortion includes out-of-plane distortion and/or in-plane distortion.

7. A method of claim 1, further comprising:
    determining an impact of the amelioration pattern on an overlay error of one or more patterns on a front side of the semiconductor wafer, the front side of being on the opposite the backside of the semiconductor wafer; and
    feed-forwarding the impact of the amelioration pattern to other tools being used in a fabrication process of the wafer.

8. A method of claim 1, wherein the determining of local distortions includes:
    mapping the multiple discretized pixels onto the semiconductor wafer, wherein each multiple discretized pixel being mapped to an area of the semiconductor wafer;
    for each of the multiple discretized pixels, calculating a value of local distortion that represents amplitude of distortion for that pixel.

9. A method of claim 1, wherein the estimating the one or more forces at each pixel includes:
    modeling forces on a pixel that replicates the local distortion of that pixel and contributes to the global distortion;
    iteratively performing the modeling with varying forces until an optimized value of one or more forces is found for each pixel;
    assigning the optimized value of the one or more forces to its pixel.

10. A method of claim 1, wherein the generation of the amelioration pattern includes:
    obtaining a range of distortion that is possible for each pixel;
    limiting the amelioration pattern to account for distortions within the obtained range.

11. A method of claim 1, wherein, when the generated amelioration pattern is applied to the corresponding discretized pixel of a backside of the semiconductor, the amelioration pattern ameliorates the local distortion of the semiconductor wafer.

12. A system of claim 11 further comprising a backside-pattern component to apply the backside layer to the backside of the semiconductor wafer, wherein the backside layer is patterned in accordance with the generated amelioration pattern.

13. A system of claim 11, wherein the generation of the backside-pattern generator includes:
storage of the amelioration pattern;
storage of an image of the amelioration pattern; or
production of instructions to direct a tool to apply the backside layer to the backside of the semiconductor wafer using the generated amelioration pattern; or
determination of dimensions of the amelioration pattern for the backside layer applied to the semiconductor wafer; or
determination of dimensions and/or composition of the backside layer to be applied to the backside of the substrate.

14. A system of claim 11, wherein the determination of local distortions includes:
generation of a map of the multiple discretized pixels onto the semiconductor wafer, wherein each multiple discretized pixel being mapped to an area of the semiconductor wafer;
calculation, for each of the multiple discretized pixels, of a value of local distortion that represents amplitude of distortion for that pixel.

15. A method comprising:
obtaining shape data of a semiconductor wafer, wherein the shape data represents a distortion of the semiconductor wafer;
calculating equibiaxial wafer stress of the semiconductor wafer, wherein the calculations are based on the obtained shape data;
obtaining initial custom parameters of the semiconductor wafer;
calculating wafer distortion based on the calculated equibiaxial wafer stress and the obtained, at least in part on custom parameters;
determining the residual wafer shape as a difference between the obtained wafer shape data and a calculated wafer shape;
updating custom parameters to reduce residual wafer shape or wafer distortion, or both;
optimizing a solution to plate theory equations by repeating the wafer-shape calculation and residual wafer shape determination with differing custom parameters;
generating an amelioration pattern based, at least in part, on the solution, the amelioration pattern being capable ameliorating the distortion of the semiconductor wafer when applied to a backside of the semiconductor wafer, ameliorates the distortion of the semiconductor wafer.

16. A method of claim 15, wherein the optimizing of the solution is based, at least in part, on one or more metrics of the semiconductor wafer falling within a predefined range.

17. A method of claim 1, wherein the generation of the amelioration pattern includes: producing a coverage layout based on the generated amelioration pattern, wherein each pixel of a coverage layout is based digital patterns in a coverage library.

18. A non-transitory computer-readable storage medium comprising instructions that when executed cause a processor of a computing device to perform the method of claim 1.

19. A system comprising:
a wafer-shape meter to obtain shape data of a semiconductor wafer, wherein the shape data represents a global distortion of the semiconductor wafer;
a wafer simulator to determine, based, at least in part, on the obtained shape data, local distortion of each of multiple discretized pixels of the semiconductor wafer;
a stress estimator to estimate one or more forces at each pixel that produces the determined local distortion of each of the multiple pixels and contributes to the global distortion of the semiconductor wafer;
a backside-pattern generator to generate, for each of the multiple discretized pixels and using the estimated forces for each pixel, an amelioration pattern of a backside layer that, when applied to a corresponding discretized pixel of a backside of the semiconductor wafer, ameliorates the global distortion of the semiconductor wafer.

20. A method of claim 15, wherein the custom parameters are selected from a group consisting of number of backside layers, the film properties, coverage boundaries, and pixel size.

* * * * *

UNITED STATES PATENT AND TRADEMARK OFFICE
CERTIFICATE OF CORRECTION

PATENT NO. : 10,622,233 B2  
APPLICATION NO. : 16/054725  
DATED : April 14, 2020  
INVENTOR(S) : Joshua Hooge et al.

Page 1 of 1

It is certified that error appears in the above-identified patent and that said Letters Patent is hereby corrected as shown below:

In the Claims

Column 14, Line 66, "12" should read --13--.

Column 14, Line 66, "11" should read --12--.

Column 15, Line 4, "13" should read --14--.

Column 15, Line 4, "11" should read --12--.

Column 15, Line 17, "14" should read --15--.

Column 15, Line 17, "11" should read --12--.

Column 15, Line 26, "15" should read --16--.

Column 16, Line 9, "16" should read --17--.

Column 16, Line 9, "15" should read --16--.

Column 16, Line 12, "17" should read --18--.

Column 16, Line 17, "18" should read --19--.

Column 16, Line 20, "19" should read --12--.

Column 16, Line 38, "15" should read --16--.

Signed and Sealed this  
Twenty-fourth Day of November, 2020

Andrei Iancu  
*Director of the United States Patent and Trademark Office*